(12) United States Patent
Kashefi et al.

(10) Patent No.: US 9,224,594 B2
(45) Date of Patent: Dec. 29, 2015

(54) SURFACE PREPARATION WITH REMOTE PLASMA

(71) Applicant: Intermolecular Inc., San Jose, CA (US)

(72) Inventors: Kevin Kashefi, San Jose, CA (US); Frank Greer, Pasadena, CA (US)

(73) Assignee: Intermolecular, Inc., San Jose, CA (US)

( * ) Notice: Subject to any disclaimer, the term of this patent is extended or adjusted under 35 U.S.C. 154(b) by 65 days.

(21) Appl. No.: 14/083,124

(22) Filed: Nov. 18, 2013

(65) Prior Publication Data

US 2015/0140834 A1    May 21, 2015

(51) Int. Cl.
*H01L 21/314* (2006.01)
*H01L 21/02* (2006.01)
*H01L 29/51* (2006.01)

(52) U.S. Cl.
CPC ...... *H01L 21/02304* (2013.01); *H01L 21/0228* (2013.01); *H01L 21/02046* (2013.01); *H01L 21/02181* (2013.01); *H01L 21/02236* (2013.01); *H01L 21/02252* (2013.01); *H01L 21/02301* (2013.01); *H01L 29/517* (2013.01)

(58) Field of Classification Search
USPC .................... 438/758, 761, 765, 766, 767
See application file for complete search history.

(56) References Cited

U.S. PATENT DOCUMENTS

| | | | |
|---|---|---|---|
| 5,478,400 A * | 12/1995 | Shimizu | C23C 14/022 118/733 |
| 6,613,695 B2 | 9/2003 | Pomarede | |
| 6,638,859 B2 | 10/2003 | Sneh | |
| 6,790,476 B1 * | 9/2004 | Jennison | C23C 14/024 204/192.1 |
| 6,897,119 B1 * | 5/2005 | Sneh | C23C 16/02 438/400 |
| 7,160,577 B2 | 1/2007 | Ahn | |
| 7,202,166 B2 | 4/2007 | Wilk | |
| 7,205,186 B2 * | 4/2007 | Wang et al. | 438/197 |
| 7,799,680 B2 | 9/2010 | Wilk | |
| 7,985,680 B2 | 7/2011 | Hasegawa | |
| 8,080,312 B2 | 12/2011 | Mcnerny | |
| 8,110,503 B2 | 2/2012 | Kumar | |
| 8,822,313 B2 * | 9/2014 | Lang | H01L 21/02 438/485 |
| 8,993,055 B2 * | 3/2015 | Rahtu | C23C 16/32 427/249.17 |
| 2001/0029092 A1 * | 10/2001 | Park et al. | 438/585 |
| 2002/0043466 A1 * | 4/2002 | Dordi et al. | 205/123 |
| 2004/0018320 A1 * | 1/2004 | Nicolussi | H01J 37/32009 427/535 |
| 2005/0161434 A1 * | 7/2005 | Sugawara et al. | 216/67 |
| 2005/0271813 A1 * | 12/2005 | Kher | C23C 16/0272 427/248.1 |
| 2007/0228453 A1 * | 10/2007 | Yamazaki et al. | 257/316 |
| 2012/0255612 A1 | 10/2012 | Pierreux | |
| 2014/0273493 A1 * | 9/2014 | Limdulpaiboon | H01L 29/778 438/723 |
| 2015/0132916 A1 * | 5/2015 | Kim | H01L 27/10844 438/381 |

OTHER PUBLICATIONS

J.Y Jason Lin et al.; Increase in Current Density for Metal Contacts to NGermanium by Inserting TiO2 Interfacial Layer to Reduce Schottky Barrier Height; ; AIP Applied Physics Letter; Unknown.

* cited by examiner

*Primary Examiner* — Bradley K Smith
*Assistant Examiner* — David Goodwin (57) ABSTRACT

Methods and apparatus for processing using a plasma source for the treatment of semiconductor surfaces are disclosed. The apparatus includes an outer vacuum chamber enclosing a substrate support, a plasma source (either a direct plasma or a remote plasma), and an optional showerhead. Other gas distribution and gas dispersal hardware may also be used. The plasma source may be used to generate activated species operable to alter the surface of the semiconductor materials. Further, the plasma source may be used to generate activated species operable to enhance the nucleation of deposition precursors on the semiconductor surface.

22 Claims, 5 Drawing Sheets

SURFACE PREPARATION WITH REMOTE PLASMA

TECHNICAL FIELD

The present disclosure relates generally to methods and apparatuses for processing using a remote plasma source for surface preparation, treatment, cleaning, and layer formation.

BACKGROUND

Plasmas are widely used for a variety of treatment and layer deposition tasks in semiconductor fabrication and other thin film applications. These applications include subtractive processes such as wafer precleaning, contaminant removal, native oxide removal, photoresist removal, plasma etching, as well as treatment processes such as oxidation, nitridation, or hydridation of a layer both during and after formation. "Remote" plasma sources are frequently used, where the plasma is located at some distance from the surface to be treated or substrate on which a layer is being formed. The distance allows some filtering of the charged particles in the plasma. For example, the density of electrons and ions can be adjusted or removed from the generated plasma.

As integrated circuit feature sizes decrease, other device dimensions also decrease to maintain the proper device operation. For example, as gate conductor widths decrease, the thickness of the gate dielectric needs to decrease to provide proper capacitance to control the transistor.

To meet the requirements of sub-20 nm devices, an equivalent oxide thickness (EOT) of less than 1.5 nm is needed. Using $SiO_2$ as the gate dielectric, it is difficult to maintain its dielectric property below about 2 nm thickness due to the high leakage due to tunneling.

High-k materials, (e.g., dielectric materials having a dielectric constant k greater than that of $SiO_2$ (k~3.9)), can provide high capacitance with higher thickness, and thus have been investigated as a replacement for $SiO_2$. For example, a high-k value of 20, which can be obtained with various transition metal oxides such as hafnium oxide, can be about five times thicker than a $SiO_2$ film with similar capacitance value. The thicker gate dielectric layer of the high-k material can reduce tunneling leakage current through the gate, enabling sub-20 nm MOSFET devices.

The fabrication of high-k gate dielectric layers can provide difficulty in realizing the full benefits of the high dielectric constant. For example, processing high-k dielectric layers in the presence of oxygen at elevated temperatures, (e.g., high-k deposition or subsequent anneal processes), can form a $SiO_2$ interfacial layer between the silicon substrate and the high-k layer. The $SiO_2$ interfacial layer can increase the effective oxide thickness, reducing the capacitance of the gate dielectric layer. Further, high-k gate dielectrics can contain a greater number of bulk traps and interface traps than thermally grown $SiO_2$ gate dielectrics. The traps can degrade the device performance by mechanisms such as sub-threshold slope, threshold voltage, flatband voltage shift, and Frenkel-Poole tunneling leakage.

Logic devices are increasingly using germanium-based layers as the semiconductor channel in advanced transistors. The germanium-based layers may include germanium or silicon-germanium alloys. Germanium oxidizes more easily than silicon when exposed to ambient conditions. Further, the germanium oxides exhibit reduced stability when compared to the silicon oxides. Typically, these oxides must be removed before the formation of the transistor gate stack and/or the source and drain contacts to the transistor. The native oxide formed on the germanium surface can be removed using plasma treatments with hydrogen. However, the cleaned surface is not ideal for the nucleation of precursors used in the deposition of high-k layers such as aluminum oxide or hafnium oxide.

What is needed is a system and methods that enable the repeatable and controllable deposition of thin films used in the manufacture of microelectronic devices, such as the use of direct or remote plasmas to condition the surface of materials present on semiconductor surfaces prior to further processing.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Methods and apparatus for processing using a plasma source for the treatment of semiconductor surfaces are disclosed. The apparatus includes an outer vacuum chamber enclosing a substrate support, a plasma source (either a direct plasma or a remote plasma), and an optional showerhead. Other gas distribution and gas dispersal hardware may also be used. A substrate heater can be mounted in the substrate support. A transport system moves the substrate support and is capable of positioning the substrate. The plasma source may be used to generate activated species operable to alter the surface of the semiconductor materials. Further, the plasma source may be used to generate activated species operable to enhance the nucleation of deposition precursors on the semiconductor surface.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which.

DETAILED DESCRIPTION

A detailed description of one or more embodiments is provided below along with accompanying figures. The detailed description is provided in connection with such embodiments, but is not limited to any particular example.

The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Before various embodiments are described in detail, it is to be understood that unless otherwise indicated, this invention is not limited to specific layer compositions or surface treatments. It is also to be understood that the terminology used herein is for the purpose of describing particular embodiments only and is not intended to limit the scope of the present invention.

It must be noted that as used herein and in the claims, the singular forms "a," "an," and "the" include plural referents unless the context clearly dictates otherwise. Thus, for example, reference to "a layer" includes two or more layers, and so forth.

Where a range of values is provided, it is understood that each intervening value, to the tenth of the unit of the lower limit unless the context clearly dictates otherwise, between the upper and lower limit of that range, and any other stated or intervening value in that stated range, is encompassed within the invention. The upper and lower limits of these smaller ranges may independently be included in the smaller ranges, and are also encompassed within the invention, subject to any specifically excluded limit in the stated range. Where the stated range includes one or both of the limits, ranges excluding either or both of those included limits are also included in the invention. The term "about" generally refers to ±10% of a stated value.

The term "site-isolated" as used herein refers to providing distinct processing conditions, such as controlled temperature, flow rates, chamber pressure, processing time, plasma composition, and plasma energies. Site isolation may provide complete isolation between regions or relative isolation between regions. Preferably, the relative isolation is sufficient to provide a control over processing conditions within ±10%, within ±5%, within ±2%, within ±1%, or within ±0.1% of the target conditions. Where one region is processed at a time, adjacent regions are generally protected from any exposure that would alter the substrate surface in a measurable way.

The term "site-isolated region" is used herein to refer to a localized area on a substrate which is, was, or is intended to be used for processing or formation of a selected material. The region can include one region and/or a series of regular or periodic regions predefined on the substrate. The region may have any convenient shape, e.g., circular, rectangular, elliptical, wedge-shaped, etc. In the semiconductor field, a region may be, for example, a test structure, single die, multiple dies, portion of a die, other defined portion of substrate, or an undefined area of a substrate, e.g., blanket substrate which is defined through the processing.

The term "substrate" as used herein may refer to any workpiece on which formation or treatment of material layers is desired. Substrates may include, without limitation, silicon, germanium, silicon-germanium alloys, gallium arsenide, indium gallium arsenide, indium gallium antimonide, silica, sapphire, zinc oxide, silicon carbide, aluminum nitride, Spinel, coated silicon, silicon on oxide, silicon carbide on oxide, glass, gallium nitride, indium nitride, and combinations (or alloys) thereof. The term "substrate" or "wafer" may be used interchangeably herein. Semiconductor wafer shapes and sizes can vary and include commonly used round wafers of 50 mm, 100 mm, 150 mm, 200 mm, 300 mm, or 450 mm in diameter.

The term "remote plasma source" as used herein refers to a plasma (e.g., a radio frequency (RF), microwave, direct current (DC), or pulsed DC generated plasma) located at a distance from a deposition or treatment location sufficient to allow some filtering of the plasma components. For example, the density of ions and electrons can be adjusted by distance, and electrons and ions can also be filtered out using suitable electrode configurations, such as a grounded metal showerhead so that only atomic or molecular radicals reach the substrate.

The terms "high-k material", "high-k layer", and "high-k dielectric", as used herein, will be considered to be equivalent and will refer to a material and/or layer that has a dielectric constant of greater than 5.

The notation "X*" will be used to indicate an excited, activated, and/or radical species generated by a plasma where "X" is the atomic element being discussed. The X* species may be charged or neutral.

Those skilled in the art will appreciate that each of the layers discussed herein may be formed using any common formation technique such as atomic layer deposition (ALD), plasma enhanced atomic layer deposition (PE-ALD), atomic vapor deposition (AVD), ultraviolet assisted atomic layer deposition (UV-ALD), chemical vapor deposition (CVD), plasma enhanced chemical vapor deposition (PECVD), or physical vapor deposition (PVD). Generally, because of the complex morphology of the device interconnect structure, ALD, PE-ALD, AVD, or CVD are preferred methods of formation. However, any of these techniques are suitable for forming each of the various layers discussed herein. Those skilled in the art will appreciate that the teachings described herein are not limited by the technology used for the deposition process.

Advances in semiconductor processing have demanded ever-increasing functional density with continued size scaling. This scaling process has led to the adoption of high-k gate dielectrics and metal gate electrodes employed in metal gate stacks in semiconductor devices.

High-k gate dielectrics can offer methods to scale the thickness of the gate dielectric while maintaining acceptable gate leakage current. The use of high-k gate dielectrics is often accompanied by a metal gate electrode, since thin gate dielectric layers may cause depletion in polysilicon electrodes, affecting the device operation and performance. Metal gate electrodes further have an advantage of higher electrical conductance, (e.g. as compared to polysilicon gates), and thus can improve signal propagation times.

The manufacture of high-k dielectric devices entails the integration and sequencing of many unit processing steps, with potential new process developments, since in general, high-k gate dielectrics are more sensitive to process conditions than silicon dioxide. For example, interface traps and interface oxide formation can adversely affect the performance of the high-k gate structures.

The microelectronic industry continues to search for new dielectric materials that exhibit high k values (i.e. materials with a high dielectric constant) and low leakage, to enable further miniaturization of electronic devices. These materials may be used as the dielectric layer in electronic components such as gate dielectric layers, capacitors, memory cell structures, and other devices. The k value is a measure of the polarization capability of dielectric materials in response to an external electrical field, which can be used to store charges in capacitors. The ability of a dielectric material to store charge is also conveniently represented by the capacitive equivalent thickness ("CET") for gate dielectric layers. A low CET implies an increased ability to miniaturize semiconductor devices. The leakage is a measure of the material's capability to retain stored charge for a certain period of time. Both CET and leakage are important parameters for the miniaturization of electronic components such as gate dielectric layers, capacitors, memory cell structures, and other devices. Typical high-k materials include $Al_2O_3$ (k~9), HfSiO (k~5-20), $ZrO_2$ (k~25), $HfO_2$ (k~25), $Ta_2O_5$ (k~26), and rutile-$TiO_2$ (k~80).

Scaling of the gate lengths and CET is forcing the replacement of silicon dioxide as a gate dielectric by materials having high-dielectric constants (i.e., high-k materials). The goals include reduction of leakage currents and meeting requirements of reliability. Some additional consideration in selecting suitable replacement materials include silicon related band offsets, permittivity, dielectric breakdown strength, interface stability and quality with silicon, and the effective masses of the carriers.

In some embodiments, the present invention discloses methods, and structures fabricated from the methods, to form a gate dielectric, for example, hafnium oxide, hafnium silicon oxide ($HfSiO_x$), zirconium oxide, or other high k dielectrics. In the following description, hafnium oxide is used to as an illustrative example, but other high k dielectrics can be used, for example, derivatives of hafnium oxide such as hafnium silicon oxide ($HfSiO_x$) or hafnium aluminum oxide ($HfAlO_x$), or high k dielectrics having similar behaviors as compared to hafnium oxide such as zirconium oxide or zirconium oxide derivatives.

Hafnium oxide is a candidate for silicon dioxide replacement as a gate dielectric material. It has a dielectric constant of about 25 at room temperature or about six times greater than that of silicon dioxide. While this dielectric constant is more than an order of magnitude smaller than for very high-k materials such as strontium titanium oxide (STO), which has a dielectric constant of about 300, hafnium oxide has a conduction band offset of about 1.5-2.0 eV with respect to silicon, which is more than one order of magnitude higher than that of STO.

The same properties of hafnium oxide that make it a leading candidate for a gate dielectric application also give hafnium oxide a high potential for other applications, such as insulating dielectrics in capacitive elements of various memory devices or, more specifically, of dynamic random-access memory (DRAM) capacitor stacks. Because of its high dielectric constant, a thick layer of hafnium oxide can be used to achieve the same performance as a much thinner silicon dioxide layer. However, thicker hafnium oxide layers have much lower leakage currents in comparison with thinner silicon oxide layers. In addition to having a high dielectric constant, hafnium oxide is thermodynamically stable with respect to silicon, with which it may be in contact in many semiconductor applications. Many modern complementary metal-oxide-semiconductor (CMOS) and DRAM processes involve high temperatures (e.g., 600° C.) that are applied to substrates for a few seconds.

Hafnium oxide layers or structures may be deposited by a variety of physical vapor deposition (PVD) methods, including laser pulse ablation and sputtering. Other deposition techniques include chemical vapor deposition (CVD) using β-diketonate precursors, alkoxide precursors, amino precursors, or halogen-based (e.g. chloride) precursors. Atomic layer deposition (ALD) techniques may also be used to prepare layers using β-diketonate precursors, alkoxide precursors, amino precursors, or halogen-based (e.g. chloride) precursors. Different deposition techniques yield different layer structures that may have different performance characteristics.

Figure 1:
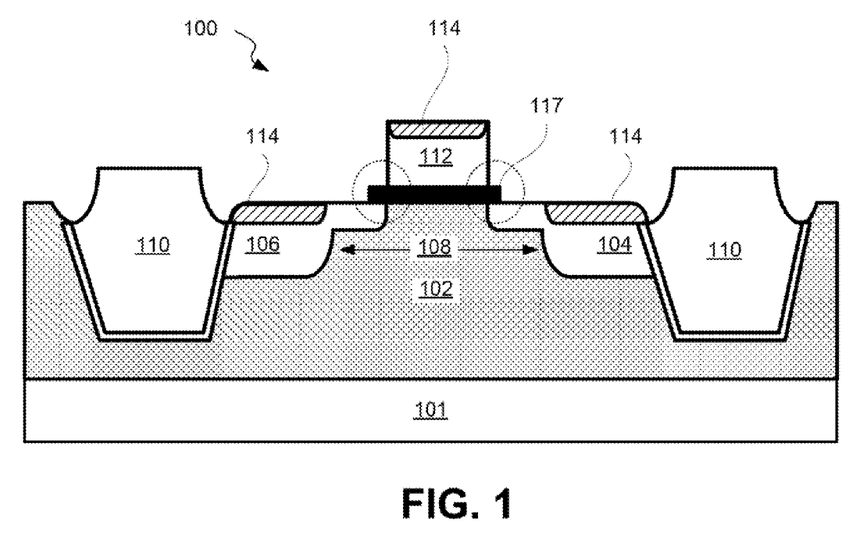
FIG. 1 illustrates a cross-sectional schematic diagram of a typical semiconductor device.

A brief description of semiconductor device examples is presented below to provide better understanding of various plasma surface treatments. Specifically, FIG. 1 illustrates a schematic representation of substrate portions including MOS device, 100, in accordance with some embodiments. The references below are made to positive metal-oxide semiconductor (PMOS) devices but other types of MOS devices can be used in the described processes and will be understood by one having ordinary skill in the art. MOS device 100 includes a p-doped substrate, 101, and an n-doped well, 102, disposed within substrate, 101. Substrate, 101, is typically a part of an overall wafer that may include other devices. Some of these devices may include silicon nitride, silicon oxide, polysilicon, or titanium nitride structures. P-doped substrate, 101, may include any suitable p-type dopants, such as boron and indium, and may be formed by any suitable technique. N-doped well, 102, may include any suitable n-type dopants, such as phosphorus and arsenic, and may be formed by any suitable technique. For example, n-doped well, 102, may be formed by doping substrate, 101, by ion implantation, for example.

MOS device, 100, also includes a conductive gate electrode, 112, that is separated from n-doped well, 102, by gate dielectric, 117. Gate electrode, 112, may include any suitable conductive material. In some embodiments, gate electrode, 112, may comprise polysilicon. In some embodiments, gate electrode, 112, may include polysilicon doped with a p-type dopant, such as boron. Gate dielectric, 117, is formed from a high-k material (e.g. hafnium oxide). Other dielectric materials include zirconium oxide or aluminum oxide. Typically, a semiconductor material with high mobility such as germanium or a silicon-germanium alloy (not shown) is formed beneath the gate dielectric.

MOS device, 100, also includes p-doped source region, 104, and drain region, 106, (or simply the source and drain) disposed in n-doped well, 102. Source, 104, and drain, 106, are located on each side of gate electrode, 112, forming channel, 108, within n-doped well, 102. Source, 104, and drain, 106, may include a p-type dopant, such as boron. Source, 104, and drain, 106, may be formed by ion implantation. After forming source, 104, and drain, 106, MOS device, 100, may be subjected to an annealing and/or thermal activation process.

In some embodiments, source, 104, drain, 106, and gate electrode, 112, are covered with a layer of self-aligned silicide portions, 114, which may be also referred to as salicide portions or simply salicides. For example, a layer of cobalt may be deposited as a blanket layer and then thermally treated to form these silicide portions, 114. Other suitable materials include nickel and other refractory metals, such as tungsten, titanium, platinum, and palladium. After forming the blanket layer from the suitable metal, the layer is subjected to rapid thermal process (RTP) to react the metal with silicon contained within gate electrode, 112, as well as within source, 104, and drain, 106, to form a metal silicide. The RTP process may be performed at 700° C. to 1000° C.

MOS device, 100, may also include shallow trench isolation (STI) structures, 110, disposed on both sides of source, 104, and drain, 106. STI structures, 110, may include liners formed on the side and bottom walls by, for example, thermal oxidation of silicon of n-doped well, 102. The main body of STI structures is formed by filling a trench within n-doped well, 102, with a dielectric material, such as silicon oxide. Silicon oxide may be filled using high density plasma (HDP) deposition process.

As shown in FIG. 1, gate dielectric, 117, may protrude beyond gate electrode, 112. As such, gate dielectric, 117, may need to be partially etched such that it does not extend past electrode, 112, and does not interfere with subsequent formation of liners and spacers on sidewalls of gate electrode, 112.

In some embodiments, the gate dielectric, 117, and/or the gate electrode, 112, may receive a surface plasma treatment to improve the performance of the device.

Figure 2:
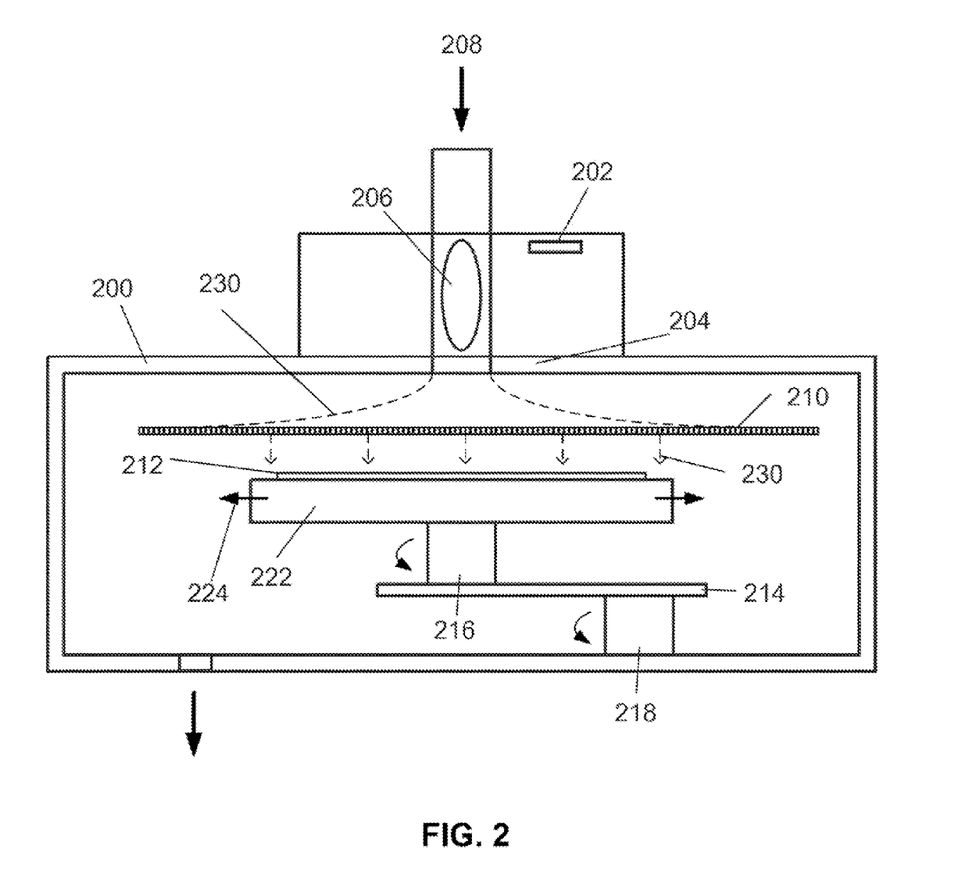
FIG. 2 illustrates a schematic diagram of an apparatus for plasma surface treatment according to some embodiments.

FIG. 2 illustrates the overall layout of some embodiments of a system enabling conventional or combinatorial processing using a remote plasma source. A discussion of the system may be found in co-owned U.S. patent application Ser. No. 13/328,129 filed on Dec. 16, 2011 which is herein incorporated by reference for all purposes. Portions of the '129 application are included herein to enhance the understanding of the present disclosure. A process chamber, 200, is provided. A remote plasma source, 202, is mounted on a chamber lid, 204, either directly as illustrated or through a short flange. The plasma, 206, is entrained into a central gas flow, 208, which is directed toward a showerhead, 210. The showerhead is disposed within the processing chamber between the remote plasma source and the substrate and is in close proximity to the substrate, 212. The showerhead further includes multiple regions, each region containing an inert gas port. The showerhead is operable to provide exposure of reactive species from the remote plasma source to regions of the substrate. A substrate positioning system, 214, can position the substrate, 212, directly under the showerhead, 210. As illustrated in FIG. 2, the substrate positioning system can provide two displaced axes of rotation, 216, and 218. The two-axis rotation configuration illustrated can provide 360° of rotation for the upper rotation (providing an angular coordinate) and 60° of rotation for the lower axis (approximating a radial coordinate) to provide all possible substrate positions. Alternatively, other positioning systems such as X-Y translators can also be used. In addition, substrate support, 222, may move in a vertical direction. It should be appreciated that the rotation and movement in the vertical direction may be achieved through known drive mechanisms which include magnetic drives, linear drives, worm screws, lead screws, a differentially pumped rotary feed through drive, etc.

The substrate support, 222, can include a substrate heater (e.g., resistive or inductive) and can be sized to be larger than the largest substrate to be processed. Substrate temperatures for most remote plasma applications are less than 500 C, although any suitable heater power and range of temperature control. The substrate support, 222, can also be configured to provide a gas purge flow, 224, for example from the edges of the support, using argon, helium, or any other gas that is not reactive under the process conditions.

Figure 3:
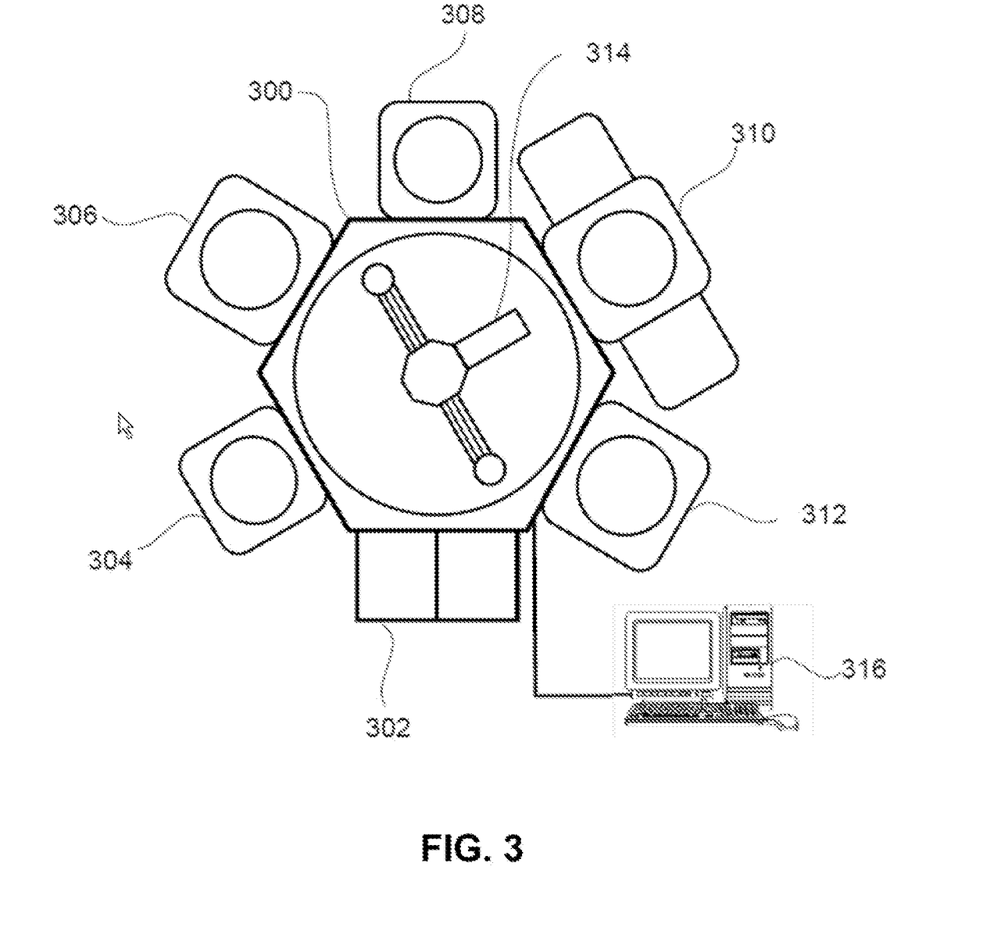
FIG. 3 illustrates a processing system enabling plasma surface treatment according to some embodiments.

FIG. 3 is a simplified schematic diagram illustrating an integrated processing system in accordance with some embodiments of the invention. The processing system includes a frame, 300, supporting a plurality of processing modules. It will be appreciated that frame, 300, may be a unitary frame in accordance with some embodiments. In some embodiments, the environment within frame, 300, is controlled. A load lock, 302, provides access into the plurality of modules of the processing system. A robot, 314, provides for the movement of substrates (and masks) between the modules and for the movement into and out of the load lock, 302. Modules, 304-312, may be any set of modules and preferably include one or more processing modules. For example, module, 304, may be an orientation/degassing module, module, 306, may be a clean module, either plasma or non-plasma based, modules, 308, and/or 310, may be dual purpose modules. Module, 312, may provide conventional clean or degas as necessary.

Any type of chamber or combination of chambers may be implemented and the description herein is merely illustrative of one possible combination and not meant to limit the potential chamber or processes that can be supported to combine combinatorial processing or combinatorial plus conventional processing of a substrate or wafer. In some embodiments, a centralized controller, i.e., computing device, 316, may control the processes of the processing system. Further details of one possible processing system are described in U.S. application Ser. Nos. 11/672,478 and 11/672,473, the entire disclosures of which are herein incorporated by reference. In a processing system, a plurality of methods may be employed to deposit material upon a substrate.

Plasmas are widely used for a variety of treatment and layer deposition tasks in semiconductor fabrication. These applications include subtractive processes such as wafer precleaning, contaminant removal, native oxide removal, photoresist removal, as well as treatment processes such as oxidation, nitridation, or hydridation of a layer both during and after formation. "Remote" plasma sources are frequently used, where the plasma is located at some distance from the surface to be treated or substrate on which a layer is to be formed. The distance allows some adjusting of the charged particles in the plasma. For example, the density of ions and electrons can be adjusted by distance, or the electrons and ions can be removed from the generated plasma using suitable electrode configurations such as a grounded metal showerhead, so that, for example, only atomic radicals and molecule radicals (but not ions) reach the substrate.

The plasma generator for a remote plasma source can use any known means of coupling energy into atoms or molecules to ionize them and create a plasma. The energy source can be, for example, electromagnetic energy such as microwaves, radio frequency energy, or lasers.

Typically, systems using remote plasma sources were designed to treat the entire area of a substrate, such as a 300 mm wafer. Combinatorial processing is difficult and expensive when the entire area of a substrate can only receive a single process variation. Some embodiments of the present invention overcome this limitation by providing a remote plasma source, an associated substrate positioning system, and a site isolation system that allows a selected region of a substrate to be processed while the remaining regions of the substrate are protected from exposure to the plasma and reactive radical species unless or until such exposure is intended.

An apparatus for processing using remote plasma exposure of a substrate comprises an outer chamber containing: a remote plasma source, a showerhead, and a transport system comprising a substrate support and capable of positioning the substrate. The plasma exposure process parameters can be varied. The plasma exposure process parameters comprise one or more of source gases for the plasma generator, plasma filtering parameters, exposure time, gas flow rate, frequency, plasma generator power, plasma generation method, chamber pressure, substrate temperature, distance between plasma source and substrate, substrate bias voltage, or combinations thereof.

In some embodiments, methods of varying surface exposure to a plasma or reactive radical species are provided. The methods comprise exposing a substrate to a plasma or reactive radical species from a remote plasma source under a first set of process parameters, and exposing a substrate to a plasma or reactive radical species from a remote plasma source under a second set of process parameters. The process parameters can be varied in a combinatorial manner. Typically, the process parameters comprise one or more of source gases for the plasma generator, plasma filtering parameters, exposure times, gas flow rates, frequencies, plasma generator powers, plasma generation methods, chamber pressures, substrate temperatures, distances between plasma source and substrate, substrate bias voltages, or combinations thereof.

In some embodiments, a layer can be exposed to a plasma surface treatment, thereby altering one or more of the layer's properties. Examples of suitable atoms (e.g. radicals) include O*, N*, Cl*, F*, H*, and the like. The atoms may be used to change the surface properties of materials present at the surface of the substrate. Examples of gases that may be used in the remote plasma source to generate the ions or reactive neutral species include $H_2$, $H_2O$, $O_2$, $N_2$, $N_2O$, $NH_3$, $BCl_3$, $NF_3$, and the like. The concentration and composition of the various species generated in the plasma may be varied by varying a number of the process parameters as well as the gas composition. A description of using these parameters to influence the concentration and composition of the various species generated in the plasma may be found in U.S. patent application Ser. No. 14/051,287, filed on Oct. 10, 2013, and claiming priority to U.S. Provisional Application No. 61/780,128, filed on Mar. 13, 2013, each of which is herein incorporated by reference for all purposes. A discussion of an example of the use of hydrogen for the cleaning and/or etching of oxide layers present on the surface of a semiconductor (e.g. silicon, germanium, or silicon-germanium alloys) may be found in U.S. patent application Ser. No. 14/031,975, filed on Sep. 19, 2013, and claiming priority to U.S. Provisional Application No. 61/779,740, filed on Mar. 13, 2013, each of which is herein incorporated by reference for all purposes.

Figure 4:
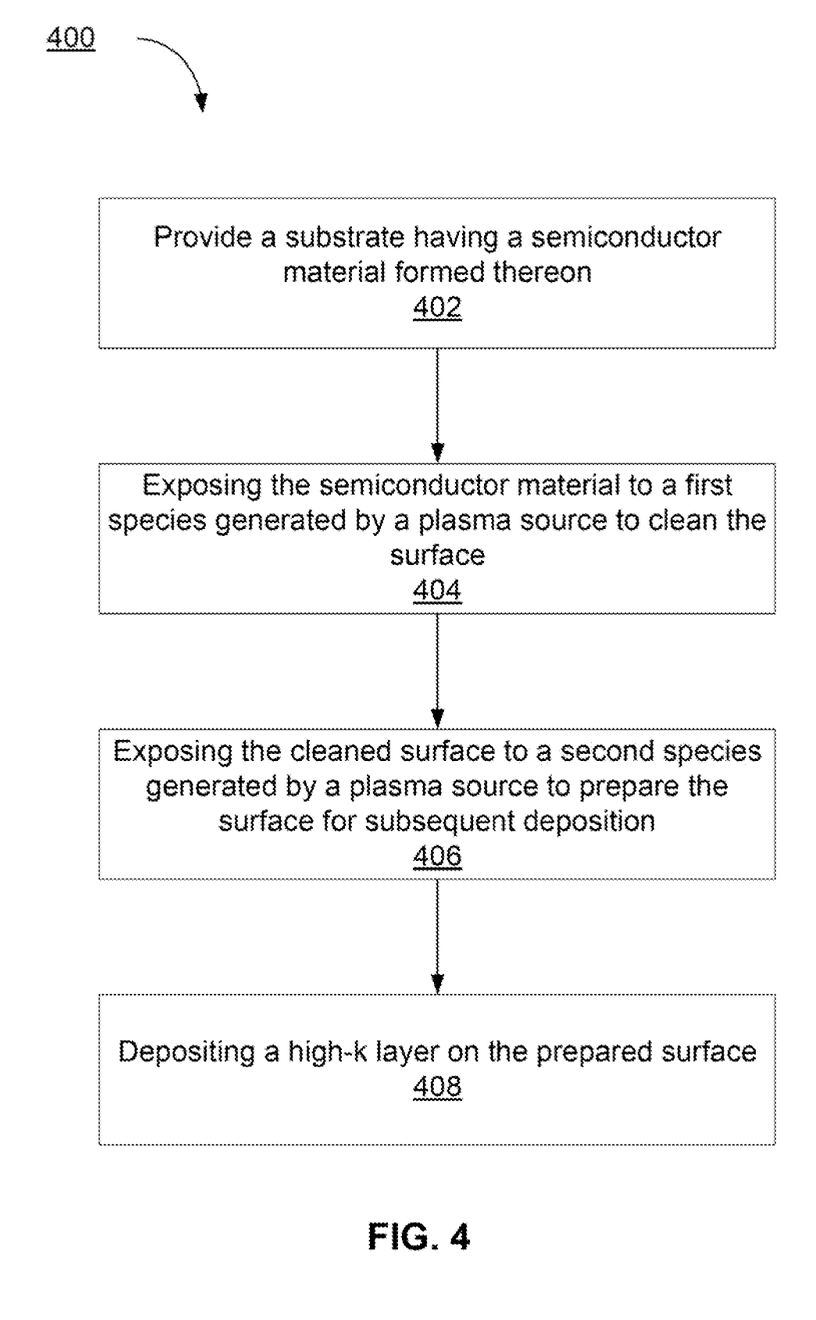
FIG. 4 illustrates a flow chart of a method according to some embodiments.

FIG. 4 illustrates a flow chart of a method according to some embodiments. In step 402, a substrate is provided having a semiconductor (e.g. germanium oxide) material formed thereon. The germanium oxide material may be formed from a germanium material or a silicon-germanium alloy material. Typically, the germanium oxide has a thickness of about 30 A (as used herein, "A" denotes an Angstrom unit=0.1 nm).

In step 404, the semiconductor (e.g. germanium oxide) material is exposed to a first species generated by a plasma source. As discussed previously, the plasma source may include a remote plasma source. The system and plasma source may be employed as described earlier. The first species that are generated may include at least one of O*, N*, Cl*, F*, or H*. Gases that may be used in the remote plasma source to generate the first species include $H_2$, $H_2O$, $O_2$, $N_2$, $N_2O$, $NH_3$, $BCl_3$, or $NF_3$. Those skilled in the art will understand that inert gases such as helium, neon, argon, krypton, and xenon may also be introduced into the plasma. Generally, these species are not active in the modification of the surface unless a bias voltage is applied to the substrate and ions of these inert gases are accelerated toward the surface. In some embodiments, the first species include H* species. The H* species may be at least one of ions or neutral species. In some embodiments, the gas used to generate the H* species includes at least one of $H_2$, $H_2O$, or $NH_3$. In some embodiments, the gas used to generate the H* species includes $H_2$.

In some embodiments, the exposure of the substrate to the first activated species is performed at a temperature between 25 C and 500 C. In some embodiments, the exposure of the substrate to the first activated species is performed at a gas flow rate (e.g. $H_2$) between 10 sccm and 500 sccm. In some embodiments, the exposure of the substrate to the first activated species further includes flowing an inert gas (e.g. argon) at a flow rate between 10 sccm and 500 sccm. In some embodiments, the exposure of the substrate to the first activated species is performed at a pressure between 0.05 Torr and 5 Torr. In some embodiments, the exposure of the substrate to the first activated species is performed at a plasma power between 50 W and 2500 W.

In some embodiments, the hydrogen species react with the semiconductor (e.g. germanium oxide, and silicon oxide if present) material on the surface of the substrate and effectively remove the oxide material(s). In some embodiments, the hydrogen species react with the cleaned semiconductor (e.g. germanium oxide, and silicon oxide if present) material on the surface and passivate the surface with Ge—H and/or Si—H bonds. The Ge—H and/or Si—H bonds will serve to retard the re-oxidation of the semiconductor surface. This passivation will allow the queue time (e.g. the wait time until the next process step, which would otherwise be limited by the rate of native-oxide regrowth) to be extended, thus leading to increased manufacturing flexibility and efficiency.

In step 406, the cleaned semiconductor (e.g. germanium oxide) material is exposed to a second species generated by a plasma source. As discussed previously, the plasma source may include a remote plasma source. The system and plasma source may be employed as described earlier. The second species that are generated may include at least one of O*, N*, Cl*, F*, or H*. Gases that may be used in the remote plasma source to generate the second species include $H_2$, $H_2O$, $O_2$, $N_2$, $N_2O$, $NH_3$, $BCl_3$, or $NF_3$. Those skilled in the art will understand that inert gases such as helium, neon, argon, krypton, and xenon may also be introduced into the plasma. Generally, these species are not active in the modification of the surface unless a bias voltage is applied to the substrate and ions of these inert gases are accelerated toward the surface. In some embodiments, the second species include O* species. The O* species may be at least one of ions or neutral species. In some embodiments, the gas used to generate the O* species includes at least one of $H_2O$, $O_2$, or $N_2O$. In some embodiments, the gas used to generate the O* species includes $O_2$.

In some embodiments, the exposure of the substrate to the second activated species is performed at a temperature between 25 C and 500 C. In some embodiments, the exposure of the substrate to the second activated species is performed at a gas flow rate (e.g. $O_2$) between 10 sccm and 500 sccm. In some embodiments, the exposure of the substrate to the second activated species further includes flowing an inert gas (e.g. argon) at a flow rate between 10 sccm and 500 sccm. In some embodiments, the exposure of the substrate to the second activated species is performed at a pressure between 0.05 Torr and 5 Torr. In some embodiments, the exposure of the substrate to the second activated species is performed at a plasma power between 50 W and 2500 W.

In some embodiments, the O* species react with the cleaned semiconductor (e.g. germanium, and silicon if present) material on the surface of the substrate and effectively prepare the material(s) for a subsequent deposition process. In some embodiments, the O* species react with the cleaned semiconductor (e.g. germanium, and silicon if present) material on the surface and prepare the surface with Ge—O and/or Si—O bonds. The Ge—O and/or Si—O bonds will serve to enhance the nucleation of precursors used to deposit high-k layers on the semiconductor surface. This preparation can decrease the nucleation delay during the deposition of the high-k layer and can result in improved thickness and uniformity control, thus leading to increased manufacturing flexibility and efficiency.

In step 408, a high-k layer (e.g. a high-k metal oxide) is formed above the prepared substrate. The high-k layer may be formed by any suitable technique such as ALD, CVD, PVD, and the like. In this disclosure, ALD will be used as an example, but this is not intended to be limiting.

In some embodiments, the high-k layer is formed using an ALD process using at least one of a halogen-based precursor or a metal organic-based precursor. In some embodiments, the metal of the high-k layer includes at least one of aluminum, hafnium, zirconium, or titanium. In some embodiments, the halogen of the halogen-based precursor includes at least one of fluorine, chlorine, or iodine. In some embodiments, the ligand of the metal organic-based precursor includes at least one of alkyl precursors, β-diketonate precursors, alkoxide precursors, or amino precursors. A portion of the precursor adsorbs onto the surface at reactive sites. The remainder of the precursor is purged from the reaction zone. An oxidant is then pulsed into the reaction zone to react with the adsorbed precursor and form a high-k metal oxide dielectric layer that acts as a gate dielectric layer. This sequence may be repeated several times to form a high-k layer that has a thickness of less than about 1.5 nm. In some embodiments, the metal of the high-k layer includes aluminum and a ligand of the metal organic-based precursor includes methyl groups (e.g. the precursor is tri-methyl aluminum).

Figure 5A:
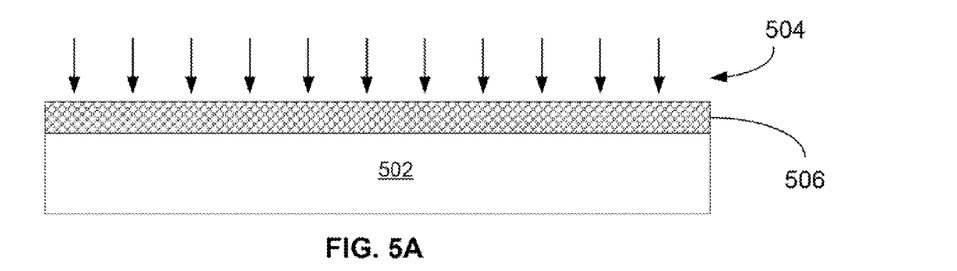
FIGS. 5A-5E illustrate schematic diagrams for plasma surface treatment according to some embodiments.

FIGS. 5A-5E illustrate schematic diagrams for plasma surface treatment according to some embodiments. In FIG. 5A, a substrate, 502, is provided that includes a semiconductor oxide (e.g. germanium oxide), 506, formed thereon. Those skilled in the art will understand that the substrate may include many layers, regions, and structures previously formed on the surface. For brevity and clarity, these elements are not included (or shown) in the figures. The substrate is exposed to a first activated species, 504, generated from a plasma source (not shown). The first activated species that are generated may include at least one of O*, N*, Cl*, F*, or H*. Gases that may be used in the plasma source to generate the first species include at least one of $H_2$, $H_2O$, $O_2$, $N_2$, $N_2O$, $NH_3$, $BCl_3$, or $NF_3$. In some embodiments, the first activated species includes H* and is operable to remove the (or at least a portion) semiconductor oxide. Those skilled in the art will understand that inert gases such as helium, neon, argon, krypton, and xenon may also be introduced into the plasma. Generally, these species are not active in the modification of the surface unless a bias voltage is applied to the substrate and ions of these inert gases are accelerated toward the surface. The H* species may be at least one of ions or neutral species. In some embodiments, the gas used to generate the H* species includes at least one of $H_2$, $H_2O$, or $NH_3$. In some embodiments, the gas used to generate the H* species includes $H_2$.

In some embodiments, the exposure of the substrate to the first activated species is performed at a temperature between 25 C and 500 C. In some embodiments, the exposure of the substrate to the first activated species is performed at a gas flow rate (e.g. $H_2$) between 10 sccm and 500 sccm. In some embodiments, the exposure of the substrate to the first activated species further includes flowing an inert gas (e.g. argon) at a flow rate between 10 sccm and 500 sccm. In some embodiments, the exposure of the substrate to the first activated species is performed at a pressure between 0.05 Torr and 5 Torr. In some embodiments, the exposure of the substrate to the first activated species is performed at a plasma power between 50 W and 2500 W.

Figure 5B:
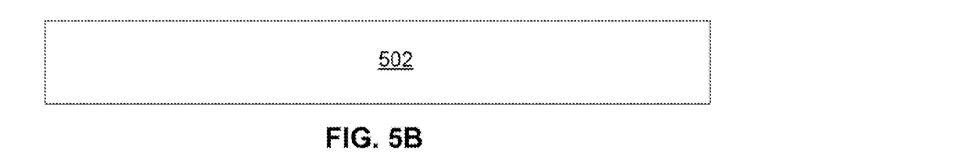

In FIG. 5B, the substrate, 502, is illustrated having the semiconductor oxide layer, 506, removed.

Figure 5C:
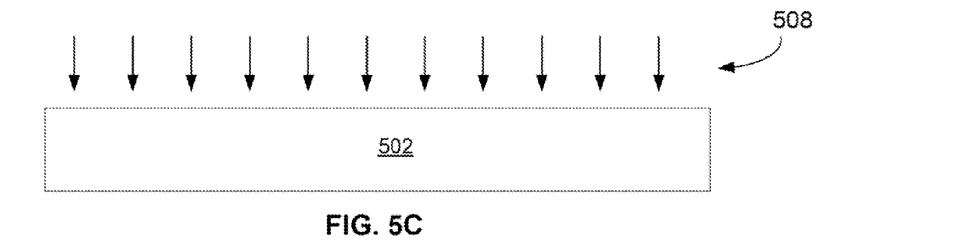

In FIG. 5C, the cleaned substrate is exposed to a second activated species, 508, generated from a plasma source (not shown) to prepare the substrate for subsequent deposition. The second activated species that are generated may include at least one of O*, N*, Cl*, F*, or H*. Gases that may be used in the plasma source to generate the second species include at least one of $H_2$, $H_2O$, $O_2$, $N_2$, $N_2O$, $NH_3$, $BCl_3$, or $NF_3$. In some embodiments, the second activated species includes O* and is operable to prepare the semiconductor surface for subsequent deposition. Those skilled in the art will understand that inert gases such as helium, neon, argon, krypton, and xenon may also be introduced into the plasma. Generally, these species are not active in the modification of the surface unless a bias voltage is applied to the substrate and ions of these inert gases are accelerated toward the surface. The O* species may be at least one of ions or neutral species. In some embodiments, the gas used to generate the O* species includes at least one of $H_2O$, $O_2$, or $N_2O$. In some embodiments, the gas used to generate the O* species includes $O_2$.

In some embodiments, the exposure of the substrate to the second activated species is performed at a temperature between 25 C and 500 C. In some embodiments, the exposure of the substrate to the second activated species is performed at a gas flow rate (e.g. $O_2$) between 10 sccm and 500 sccm. In some embodiments, the exposure of the substrate to the second activated species further includes flowing an inert gas (e.g. argon) at a flow rate between 10 sccm and 500 sccm. In some embodiments, the exposure of the substrate to the second activated species is performed at a pressure between 0.05 Torr and 5 Torr. In some embodiments, the exposure of the substrate to the second activated species is performed at a plasma power between 50 W and 2500 W.

Figure 5D:
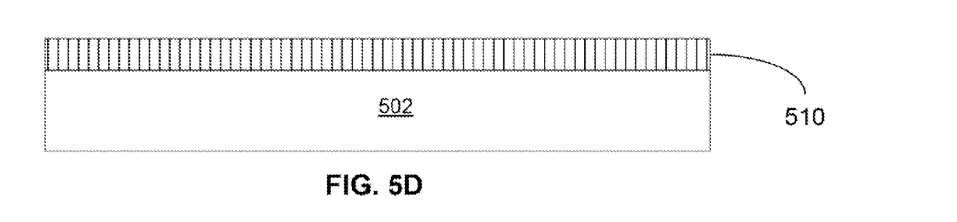

In FIG. 5D, a controlled oxide layer, 510, is formed on the substrate, 502, as a result of the exposure to the O* species, 508, to prepare the substrate for subsequent deposition. The O* species, 508, that are generated from a plasma using oxygen as the gas source are less aggressive than previously used treatments such as ozone. This preparation can decrease the nucleation delay during the deposition of the high-k layer and can result in improved thickness and uniformity control, thus leading to increased manufacturing flexibility and efficiency.

Figure 5E:
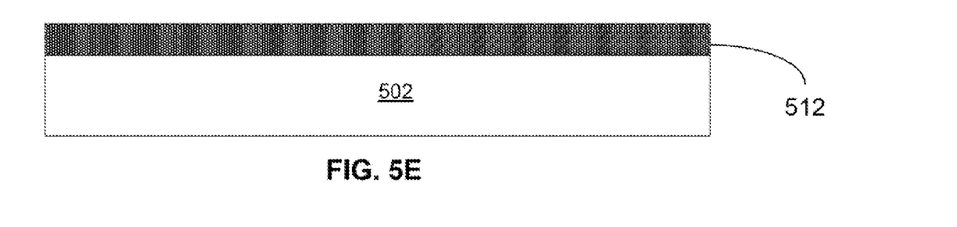

In FIG. 5E, the substrate, 502, is illustrated having a high-k dielectric layer, 512, deposited above the prepared substrate. The high-k layer may be formed by any suitable technique such as ALD, CVD, PVD, and the like. In this disclosure, ALD will be used as an example, but this is not intended to be limiting.

In some embodiments, the high-k layer is formed using an ALD process using at least one of a halogen-based precursor or a metal organic-based precursor. In some embodiments, the metal of the high-k layer includes at least one of aluminum, hafnium, zirconium, or titanium. In some embodiments, the halogen of the halogen-based precursor includes at least one of fluorine, chlorine, or iodine. In some embodiments, the ligand of the metal organic-based precursor includes at least one of alkyl precursors, β-diketonate precursors, alkoxide precursors, or amino precursors. A portion of the precursor adsorbs onto the surface at reactive sites. The remainder of the precursor is purged from the reaction zone. An oxidant is then pulsed into the reaction zone to react with the adsorbed precursor and form a high-k metal oxide dielectric layer that acts as a gate dielectric layer. This sequence may be repeated several times to form a high-k layer that has a thickness of less than about 1.5 nm. In some embodiments, the metal of the high-k layer includes aluminum and a ligand of the metal organic-based precursor includes methyl groups (e.g. the precursor is trimethyl aluminum). Those skilled in the art will realize that the controlled oxide layer, 510, is generally incorporated into the high-k dielectric layer during the deposition process.

Although the foregoing examples have been described in some detail for purposes of clarity of understanding, the invention is not limited to the details provided. There are many alternative ways of implementing the invention. The disclosed examples are illustrative and not restrictive.

What is claimed:

1. A method comprising:
providing a substrate,
  wherein the substrate comprises a layer,
  wherein the layer comprises one of silicon oxide or germanium oxide;
exposing a surface of the layer to a first activated species,
  wherein the first activated species are generated using a plasma source,
  wherein the first activated species comprises H*;
after exposing the surface of the layer to a first activated species, exposing the surface of the layer to a second activated species forming a treated surface comprising silicon-oxygen bonds or germanium-oxygen bonds,
  wherein the second activated species are generated using a plasma source,
  wherein the second activated species comprises O*; and
after exposing the surface of the layer to the second activated species, depositing a high-k dielectric layer on the treated surface of the layer using atomic layer deposition,
wherein the silicon-oxygen bonds or the germanium-oxygen bonds are exposed to one or more precursors used during the atomic layer deposition.

2. The method of claim 1, wherein the layer comprises at least one of germanium or germanium-silicon alloy.

3. The method of claim 1, wherein a gas used to generate the first activated species comprises at least one of $H_2$, $H_2O$, or $NH_3$.

4. The method of claim 3, wherein the gas used to generate the first activated species comprises $H_2$.

5. The method of claim 1, wherein a gas used to generate the second activated species comprises at least one of $H_2O$, $O_2$, or $N_2O$.

6. The method of claim 5, wherein the gas used to generate the second activated species comprises $O_2$.

7. The method of claim 1, wherein the one or more precursors used in the depositing of the high-k layer comprises at least one of halogen-based precursor or a metal organic-based precursor.

8. The method of claim 7, wherein the one or more precursors used in the depositing of the high-k layer comprises at least one of alkyl precursors, β-diketonate precursors, alkoxide precursors, or amino precursors.

9. The method of claim 7, wherein the one or more precursors used in the depositing of the high-k layer comprises trimethyl aluminum.

10. The method of claim 1, wherein the high-k dielectric layer comprises aluminum oxide.

11. The method of claim 1, wherein the exposing the surface of the layer to the first activated species is performed at a temperature between 25 C and 500 C.

12. The method of claim 1, wherein the exposing the surface of the layer to the first activated species is performed in an atmosphere comprising flowing $H_2$ gas at a rate between 10 sccm and 500 sccm.

13. The method of claim 1, wherein the exposing the surface of the layer to the first activated species further comprises flowing argon and is performed in an atmosphere comprising flowing argon gas at a rate between 10 sccm and 500 sccm.

14. The method of claim 1, wherein the exposing the surface of the layer to the first activated species is performed at a pressure between 0.05 Torr and 5 Torr.

15. The method of claim 1, wherein the exposing the surface of the layer to the first activated species is performed at a plasma power between 50 W and 2500 W.

16. The method of claim 1, wherein the exposing the surface of the layer to the second activated species is performed at a temperature between 25 C and 500 C.

17. The method of claim 1, wherein the exposing the surface of the layer to the second activated species is performed in an atmosphere comprising flowing O2 gas at a rate between 10 sccm and 500 sccm.

18. The method of claim 1, wherein the exposing the surface of the layer to the second activated species further comprises flowing argon and is performed in an atmosphere comprising flowing argon gas at a rate between 10 sccm and 500 sccm.

19. The method of claim 1, wherein the exposing the surface of the layer to the second activated species is performed at a pressure between 0.05 Torr and 5 Torr.

20. The method of claim 1, wherein the exposing the surface of the layer to the second activated species is performed at a plasma power between 50 W and 2500 W.

21. The method of claim 1, wherein a metal of the high-k layer comprises at least one of aluminum, hafnium, zirconium, or titanium.

22. The method of claim 21, wherein the metal of the high-k layer comprises aluminum.

* * * * *